US011563147B2

(12) United States Patent
Tchoulfian et al.

(10) Patent No.: US 11,563,147 B2
(45) Date of Patent: Jan. 24, 2023

(54) OPTOELECTRONIC DEVICE COMPRISING THREE-DIMENSIONAL LIGHT-EMITTING DIODES

(71) Applicant: Aledia, Grenoble (FR)

(72) Inventors: Pierre Tchoulfian, Grenoble (FR); Benoît Amstatt, Grenoble (FR); Philippe Gilet, Teche (FR)

(73) Assignee: Aledia, Echirolles (FR)

( * ) Notice: Subject to any disclaimer, the term of this patent is extended or adjusted under 35 U.S.C. 154(b) by 0 days.

(21) Appl. No.: 16/958,130

(22) PCT Filed: Dec. 6, 2018

(86) PCT No.: PCT/EP2018/083890
§ 371 (c)(1),
(2) Date: Jun. 25, 2020

(87) PCT Pub. No.: WO2019/129473
PCT Pub. Date: Jul. 4, 2019

(65) Prior Publication Data
US 2020/0365762 A1 Nov. 19, 2020

(30) Foreign Application Priority Data

Dec. 28, 2017 (FR) ...................................... 1763316

(51) Int. Cl.
*H01L 33/14* (2010.01)
*H01L 33/06* (2010.01)
(Continued)

(52) U.S. Cl.
CPC ........ *H01L 33/145* (2013.01); *H01L 33/0025* (2013.01); *H01L 33/06* (2013.01); *H01L 33/24* (2013.01); *H01L 33/32* (2013.01)

(58) Field of Classification Search
CPC ... H01L 33/145; H01L 33/0025; H01L 33/06; H01L 33/24; H01L 33/32
See application file for complete search history.

(56) References Cited

U.S. PATENT DOCUMENTS

2014/0264260 A1* 9/2014 Chang .................. H01L 33/005
257/13
2014/0361244 A1* 12/2014 Svensson ............... H01L 33/06
257/13

(Continued)

FOREIGN PATENT DOCUMENTS

EP          2 144 306 A1    1/2010
KR      2017 0063213 A     6/2017

(Continued)

OTHER PUBLICATIONS

International Search Report and Written Opinion for International Application No. PCT/EP2018/083890, dated Dec. 21, 2018.

(Continued)

*Primary Examiner* — Mark W Tornow
(74) *Attorney, Agent, or Firm* — Wolf, Greenfield & Sacks, P.C.

(57) ABSTRACT

An optoelectronic device including: a three-dimensional semiconductor element mostly made of a first chemical element and of a second chemical element; an active area at least partially covering the lateral walls of the three-dimensional semiconductor element and including a stack of at least a first layer mostly made of the first and second chemical elements, and of at least a second layer mostly made of the first and second chemical elements and of a third chemical element; a third layer covering the active area, the third layer being mostly made of the first, second, and third chemical elements and of a fourth chemical element, the mass proportion of the third and fourth chemical elements of the third layer increasing or decreasing as the distance to the (Continued)

substrate increases; and a fourth layer, mostly made of the first and second chemical elements, covering the third layer.

14 Claims, 2 Drawing Sheets

(51) Int. Cl.
*H01L 33/24* (2010.01)
*H01L 33/32* (2010.01)
*H01L 33/00* (2010.01)

(56) References Cited

U.S. PATENT DOCUMENTS

2015/0207028 A1* 7/2015 Romano ............... H01L 27/153
257/13
2017/0084781 A1* 3/2017 Robin .................... H01L 33/38

FOREIGN PATENT DOCUMENTS

| WO | WO 2013/147453 A1 | 10/2013 | | |
|----|-------------------|---------|---|---|
| WO | WO 2016/116703 A1 | 7/2016 | | |
| WO | WO 2016/208993 A1 | 12/2016 | | |
| WO | WO-2016208993 A1 * | 12/2016 | ............. | H01L 33/20 |

OTHER PUBLICATIONS

PCT/EP2018/083890, Dec. 21, 2018, International Search Report and Written Opinion.
International Preliminary Report on Patentability for International Application No. PCT/EP2018/083890, dated Jul. 9, 2020.

* cited by examiner

OPTOELECTRONIC DEVICE COMPRISING THREE-DIMENSIONAL LIGHT-EMITTING DIODES

This application is a national stage filing under 35 U.S.C. § 371 of International Patent Application Serial No. PCT/EP2018/083890, filed Dec. 6, 2018, which claims priority to French patent application FR17/63316, filed Dec. 28, 2017. The contents of these applications are incorporated herein by reference in their entireties.

BACKGROUND

The present application generally concerns optoelectronic devices comprising three-dimensional light-emitting diodes made up of semiconductor materials.

DISCUSSION OF THE RELATED ART

A pixel of an image corresponds to the unit element of the image displayed by the optoelectronic device. For the display of color images, the optoelectronic device generally comprises, for the display of each pixel of the image, at least three components, also called display sub-pixels, which each emit a light radiation substantially in a single color (for example, red, green, and blue). The superposition of the radiations emitted by the three display sub-pixels provides the observer with the colored sensation corresponding to the pixel of the displayed image. In this case, the assembly formed by the three display sub-pixels used to display a pixel of an image is called display pixel of the optoelectronic device.

There exist optoelectronic devices comprising three-dimensional semiconductor elements enabling to form three-dimensional light-emitting diodes (or LEDs). Each light-emitting diode comprises an active area covering the lateral walls of the three-dimensional semiconductor element. The active area is the area of the light-emitting diode which emits most of the radiation emitted by the light-emitting diode. The active area is covered with an electron blocking layer (EBL). During the manufacturing of the EBL, the content of certain elements may be non-homogeneous over the EBL. Similarly, the active area may cover a hole blocking layer (HBL) and the content of certain elements may be non-homogeneous over the HBL. This may cause a non-homogeneous distribution of the current supplying the active area. Accordingly, the intensity of the radiation emitted by the active area may be non-homogeneous over the active area and the efficiency of the light-emitting diode may be sub-optimal.

SUMMARY

Thus, an object of an embodiment is to at least partly overcome the disadvantages of the previously-described optoelectronic devices.

Thus, an embodiment provides an optoelectronic device comprising:
  a substrate;
  a three-dimensional semiconductor element, mostly made of a first chemical element and of a second chemical element, resting on the substrate;
  an active area at least partially covering the lateral walls of the three-dimensional semiconductor element and comprising a stack of at least a first layer mostly made of the first and second chemical elements, and of at least a second layer mostly made of the first and second chemical elements and of a third chemical element;
  a third layer covering the active area, the third layer being mostly made of the first, second, and third chemical elements and of a fourth chemical element, the mass proportion of the third and fourth chemical elements of the third layer increasing or decreasing as the distance to the substrate increases; and
  a fourth layer, mostly made of the first and second chemical elements, covering the third layer.

According to an embodiment, the active area is capable of emitting an electromagnetic radiation and the third layer is a charge carrier blocking layer.

According to an embodiment, the content of the third chemical element in the third layer is in the range from 0.1 to 10%.

According to an embodiment, the content of the fourth chemical element in the third layer is in the range from 10 to 40%.

According to an embodiment, the first chemical element is a group-III element.

According to an embodiment, the first chemical element is gallium.

According to an embodiment, the second chemical element is a group-V element.

According to an embodiment, the second chemical element is nitrogen.

According to an embodiment, the third chemical element is a group-III element.

According to an embodiment, the third chemical element is indium.

According to an embodiment, the fourth chemical element is a group-III element.

According to an embodiment, the fourth chemical element is aluminum.

According to an embodiment, the semiconductor element is wire-shaped.

According to an embodiment, the semiconductor element is pyramid-shaped.

According to an embodiment, the maximum variation of the bandgap in the third layer is smaller than the maximum variation of the bandgap of a same layer which does not comprise the third chemical element.

According to an embodiment, the third layer is an electron blocking layer or a hole blocking layer.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
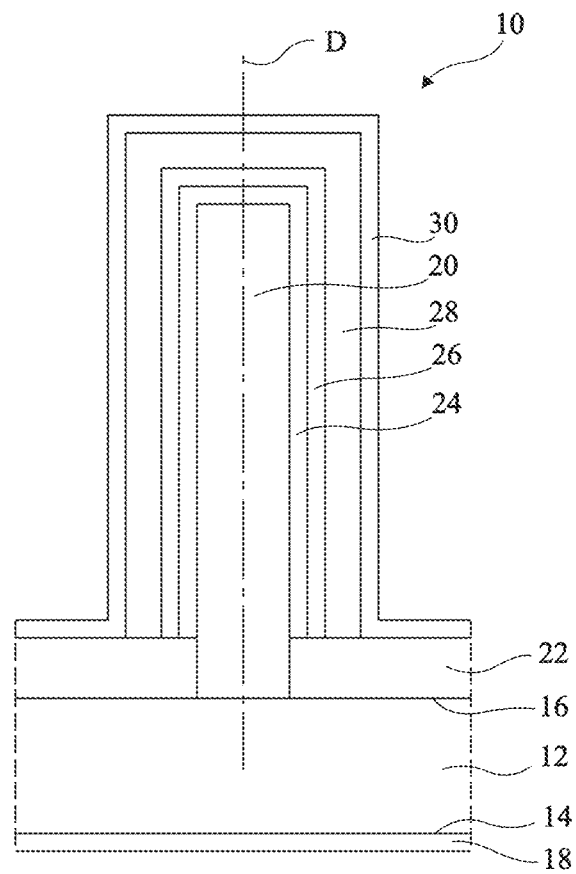
FIG. 1 is a partial simplified cross-section view of an optoelectronic device comprising a three-dimensional light-emitting diode.

The same elements have been designated with the same reference numerals in the various drawings and, further, the various drawings are not to scale. For clarity, only those steps and elements which are useful to the understanding of the described embodiments have been shown and are detailed. In particular, the means for controlling the optoelectronic device described hereafter are within the abilities of those skilled in the art and are not described.

In the following description, when reference is made to terms qualifying the relative position, such as term "upper", "lower", etc., reference is made to the orientation of the concerned elements in the drawings. The terms "approximately" and "substantially" are used herein to designate a tolerance of plus or minus 10%, preferably of plus or minus 5%, of the value in question.

The present disclosure concerns optoelectronic devices comprising light-emitting diodes with a three-dimensional shape of radial type where the active area of a light-emitting diode is formed on a semiconductor element having a three-dimensional shape, for example, the shape of a microwire, of a nanowire, or of a pyramid.

Term "microwire" or "nanowire" designates a three-dimensional structure having an elongated shape, for example, cylindrical, conical, or tapered, along a preferred direction, having at least two dimensions, called minor dimensions, in the range from 5 nm to 2.5 µm, preferably from 50 nm to 2.5 µm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 1 µm, preferably in the range from 100 nm to 1 µm, more preferably from 100 nm to 800 nm. In certain embodiments, the height of each microwire or nanowire may be greater than or equal to 50 nm, preferably in the range from 50 nm to 50 µm, more preferably from 1 µm to 10 µm. The base of the wire for example has an oval, circular, or polygonal shape, particularly triangular, rectangular, square, or hexagonal.

In the following description, term "wire" is used to mean "microwire" or "nanowire".

In the following description, term pyramid or truncated pyramid designates a three-dimensional structure having a pyramidal shape. The pyramidal structure may be truncated, that is, the top of the cone is absent and replaced with a flat area. The base of the pyramid is inscribed within a polygon having a side dimension from 100 nm to 10 µm, preferably from 1 to 3 µm. The polygon forming the base of the pyramid may be a hexagon. The height of the pyramid between the base of the pyramid and the apex or the top plateau varies from 100 nm to 25 µm, preferably from 1 µm to 10 µm.

FIG. 1 is a partial simplified cross-section of an optoelectronic device 10 capable of emitting an electromagnetic radiation.

Device 10 comprises a substrate 12, for example, semiconductor, comprising parallel surfaces 14 and 16. Surface 14 is in contact with a first biasing electrode 18.

Semiconductor elements 20, a single one of which is shown in FIG. 1, are in contact with surface 16 of substrate 12. In the example of FIG. 1, each semiconductor element 20 has the shape of a wire extending from substrate 12. Semiconductor elements 20 may however have another three-dimensional shape.

An electrically-insulating layer 22 covers surface 16 of substrate 12 and surrounds the lower portion of each wire 20, that is, the portion of each wire 20 closest to substrate 12.

The lateral walls of the upper portion of each wire 20, that is, the portion which is not surrounded with insulating layer 22, are at least partially covered, here totally covered, with an active area 24.

Active area 24 is covered with an electron blocking layer 26 or EBL.

EBL 26 is covered with a semiconductor layer 28 and with an electrically-conductive layer 30 forming a second electrode.

The assembly formed by a wire 20, active area 24, EBL 26, and semiconductor layer 28 forms a light-emitting diode. When a voltage is applied between electrodes 18 and 30, a light radiation is emitted by active area 24. When a plurality of light-emitting diodes are formed on substrate 12, they may be connected in series and/or in parallel and form an assembly of light-emitting diodes. In particular, layer 30 may cover the semiconductor layers 28 of a plurality of light-emitting diodes. Similarly, layers 26 and 28 may cover the active areas 24 of a plurality of wires 20. The number of light-emitting diodes of the optoelectronic device may vary from 1 to several hundred millions.

Electrode 18 may correspond to a conductive layer which extends on surface 14 of substrate 12. The material forming electrode 18 is, for example, nickel silicide (NiSi), aluminum (Al), aluminum silicide (AlSi), titanium (Ti), or titanium silicide (TiSi).

Substrate 12 may correspond to a monoblock structure or to a layer covering a support made of another material. Substrate 12 is preferably a semiconductor substrate, for example, a substrate made of silicon, of germanium, of silicon carbide, of a III-V compound, or of a II-VI compound, for example, of ZnO. Substrate 12 may also be made of sapphire or of graphene. Preferably, substrate 12 is a single-crystal silicon substrate. Preferably, it is a semiconductor substrate compatible with manufacturing methods implemented in microelectronics. Substrate 12 may correspond to a multilayer structure of silicon-on-insulator type, also called SOI. Substrate 12 may be heavily doped, lightly-doped, or non-doped.

Examples of group-II chemical elements comprise group-IIA chemical elements, particularly beryllium (Be) and magnesium (Mg), and group-IIB chemical elements, particularly zinc (Zn), cadmium (Cd), and mercury (Hg). Examples of group-VI chemical elements comprise group-VIA chemical elements, particularly oxygen (O) and tellurium (Te). Examples of II-VI compounds are ZnO, ZnMgO, CdZnO, CdZnMgO, CdHgTe, CdTe, or HgTe. Generally, the chemical elements in the II-VI compound may be combined with different molar fractions.

Insulating layer 22 may be made of a dielectric material or comprise a stack of dielectric layers, for example, of silicon oxide ($SiO_2$), of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$), of hafnium oxide ($HfO_2$), or of diamond. As an example, the thickness of insulating layer 22 is in the range from 1 nm to 20 µm, preferably from 5 nm to 150 nm.

Each semiconductor element 20 is in contact with surface 16 of substrate 12. As a variation, a seed layer made of a material favoring the growth of semiconductor elements 20 may be interposed between substrate 12 and semiconductor elements 20. As an example, the material forming the seed layer may be a nitride, a carbide, or a boride of a transition metal from column IV, V, or VI of the periodic table of chemical elements or a combination of these compounds. As an example, seed layer 16 may be made of aluminum nitride (AlN), of aluminum oxide ($Al_2O_3$), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate ($ZrB_2$), of zirconium nitride (ZrN), of silicon carbide (SiC), of tantalum carbo-nitride (TaCN), of magnesium nitride in $Mg_xN_y$, form, where x is approximately equal to 3 and y is approximately equal to 2, for example, magnesium nitride in form $Mg_3N_2$. The seed layer may be doped with the same conductivity type as substrate 12. The seed layer for example has a thickness in the range from 1 to 100 nanometers, preferably in the range from 10 to 30 nanometers. As a variation, the seed layer may be replaced with seed pads resting on surface 16 of substrate 12, each wire 20 resting on one of the seed pads.

Semiconductor elements 20 may be mostly formed of a compound comprising a first chemical element and a second chemical element, particularly a binary compound. The first chemical element may be a group-III element. The second chemical element may be a group-V element. Semiconductor elements 20 may thus be made of a III-V compound.

Examples of group-III chemical elements comprise gallium (Ga), indium (In), or aluminum (Al). Examples of group-V chemical elements comprise nitrogen, phosphorus, or arsenic. Examples of III-N compounds are GaN, AN, InN, InGaN, AlGaN, or AlInGaN. Generally, the chemical elements in the III-V compound may be combined with different molar fractions.

Semiconductor elements 20 may also be mostly made of an AlGaInP-type alloy.

Semiconductor elements 20 may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), selenium (Se), sulfur (S), terbium (Tb), or tin (Sn).

When the three-dimensional semiconductor elements 20 of the optoelectronic device correspond to wires, the height of each wire may be in the range from 50 nm to 50 µm. Each wire 20 may have a semiconductor structure elongated along an axis D substantially perpendicular to surface 16.

When the three-dimensional semiconductor elements 20 of optoelectronic device 10 correspond to pyramids, the height of each pyramid may be in the range from 100 nm to 25 µm. Each pyramid 20 may have a semiconductor structure elongated along an axis substantially perpendicular to surface 16.

The cross-section of each wire 20 or of each pyramid may have a general shape of oval, circular, or polygonal type, particularly triangular, rectangular, square, or hexagonal. The centers of two adjacent wires 20 or pyramids may be distant by from 0.25 µm to 10 µm and preferably from 1.5 µm to 5 µm. As an example, wires 20 or the pyramids may be regularly distributed, particularly in a hexagonal network.

Active area 24 may comprise a single quantum well. Active area 24 may thus comprise a layer mostly made of a ternary III-V compound. Preferably, active area 24 comprises a layer mostly comprising the first and second chemical elements previously described in relation with semiconductor element 20 and a third chemical element of the same group as the first chemical element other than the first chemical element.

Active layer 24 may comprise multiple quantum wells. It then comprises a stack of semiconductor layers forming an alternation of quantum wells and of barrier layers. It may be formed of an alternation of layers mostly made of a binary III-V compound, and of layers mostly made of a ternary III-V compound. Preferably, the active area comprises an alternation of layers mostly comprising the first chemical element and the second chemical element, and of layers mostly comprising the first, second, and third chemical elements.

Semiconductor layer 28 may be made of the same elements as semiconductor element 20. The semiconductor layer for example mostly comprises the first element and the second element. Semiconductor layer 28 is for example doped with a doping type opposite to the doping type of semiconductor element 20.

Electrode 30 is capable of biasing active area 24 covering each semiconductor element 20 and of giving way to the electromagnetic radiation emitted by the light-emitting diodes. The material forming electrode 30 may be a transparent and conductive material such as indium tin oxide (ITO), zinc oxide, doped or not with aluminum or gallium, or graphene. As an example, electrode layer 30 has a thickness in the range from 5 nm to 200 nm, preferably from 20 nm to 50 nm.

In known fashion, EBL 26 is mostly made of a ternary alloy comprising the first chemical element, the second chemical element, and a fourth chemical element from the same group as the first chemical element but other than the first or the third chemical element. In the case where wire 20 is made of GaN and the quantum well comprises an $In_yGa_{(1-y)}N$ layer, where y is the proportion of In, and generally designated as InGaN, it is known for the EBL to be mostly made of aluminum gallium nitride $Al_xGa_{(1-x)}N$, where x is the proportion of aluminum, and generally designated as AlGaN, and to be in contact with active area 24, to provide a good distribution of the charge carriers in active area 24. As an example, layer 26 may have a thickness in the range from 5 nm to 60 nm and the proportion of aluminum x may vary between 5% and 60%, preferably between 15% and 25%. Proportion means the atomic proportion without nitrogen. For example, in the case of the Al0,2Ga0,8N component, 20% of the atoms which are not nitrogen are aluminum and 80% of the atoms which are not nitrogen are gallium.

The method of growing each semiconductor element 20, active area 24, EBL 26, and semiconductor layer 28 may be a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), or hydride vapor phase epitaxy (HVPE) may be used.

As an example, the method may comprise injecting into a reactor a precursor the first chemical element and a precursor of the second chemical element and, optionally, a precursor of the third chemical element and/or a precursor of the fourth chemical element.

In the following description, it is considered that the first chemical element is gallium (Ga), that the second chemical element is nitride (N), that the third chemical element is indium (In), and that the fourth chemical element is aluminum (Al). The different described phenomena may however be extended to other chemical elements, such as those previously described.

Figure 2:
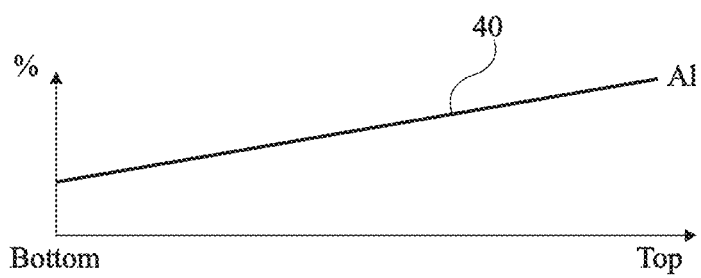
FIG. 2 shows a curve of the variation of the aluminum content and a curve of the variation of the bandgap of one of the layers of the light-emitting diode shown in FIG. 1 according to the distance to the substrate having the light-emitting diode formed thereon.
Figure 2:
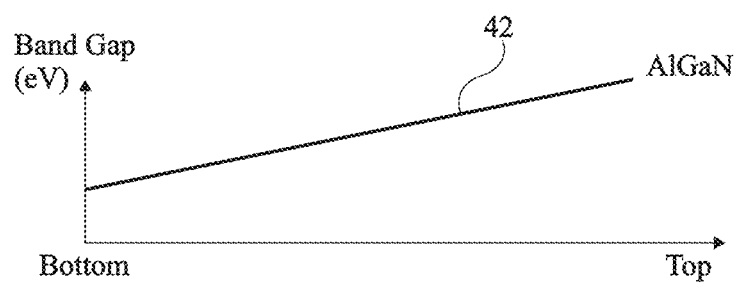

FIG. 2 shows a curve 40 of the variation of aluminum content x (in percent) in EBL 26 of the light-emitting diode shown in FIG. 1, mostly made of AlGaN, and a curve 42 of the variation of the bandgap (in electron volt) of EBL 26 according to the distance to substrate 12.

During the forming of EBL 26, the inventors have shown that the content of the fourth chemical element, here the aluminum of the AlGaN compound, may be non-constant over layer 26. Indeed, the aluminum content in layer 26 may increase or decrease when the distance between substrate 12 and the considered point of layer 26 increases. In the example illustrated by curve 40, the aluminum content increases between the lower portion ("Bottom") of wire 20 and the top ("Top") of wire 20.

Such a content variation goes along with a similar variation, illustrated by curve 42, of the bandgap of EBL 26 mostly made of AlGaN. The bandgap variation may be determined as known in the state of the art, particularly as described in Sakalauskas et al's publication entitled "Dielectric function and optical properties of quaternary AlInGaN alloys" (Journal of Applied Physics 110, 013102 (2011)). The bandgap is higher at the level of the top of wire 20 than at the level of the lower portion of wire 20. The distribution of the current flowing through active area 24, and thus the intensity of the radiation emitted by active area 24, is thus non-homogeneous. The efficiency of the light-emitting diode is thus sub-optimal.

According to an embodiment, the third element is added to the composition of EBL 26. EBL 26 is thus mostly made of a quaternary compound comprising the first, second, third, and fourth chemical elements. In the embodiment described in relation with FIGS. 3 and 4, EBL 26, instead of being made of AlGaN, is made of $Al_xIn_zGa_{(1-x-z)}N$, where x is the aluminum content, z is the indium content, which is generally designated as AlInGaN.

Figure 3:
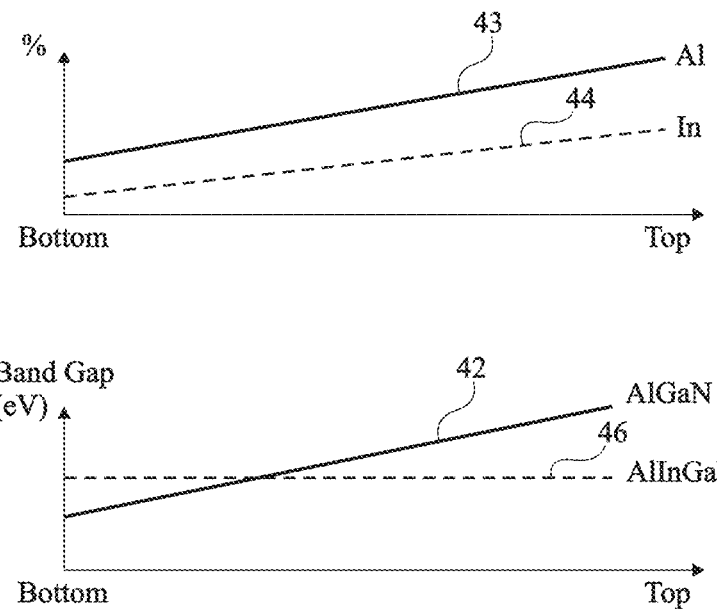
FIG. 3 shows curves of the variation of the aluminum and indium contents and curves of the variation of the bandgap of one of the layers of the light-emitting diode shown in FIG. 1 according to the distance to the substrate having the light-emitting diode formed thereon.

FIG. 3 shows curves 43 and 44 of variation of the content (in percents) of aluminum and indium in EBL 26 of the light-emitting diode shown in FIG. 1, here mostly made of AlInGaN. FIG. 3 also shows curve 42, drawn as a comparison, and a curve 46 of the variation of the bandgap (in electron volt) of the layer made of AlGaN and of that made of AlInGaN according to the distance to substrate 12.

The variations of the aluminum content in EBL 26, illustrated by curve 43, remain similar to those of the aluminum content of an EBL 26 mostly made of AlGaN. Further, the variation of the indium (In) content in EBL 26 mostly made of AlInGaN, illustrated by curve 44, is also non constant, here increasing, between the lower portion and the top of wire 20.

The inventors have shown that the variations of the bandgap of EBL 26 mostly made of AlInGaN, schematically illustrated by substantially constant curve 46 in FIG. 3, are decreased as compared with those of EBL 26 mostly made of AlGaN, illustrated by curve 42. The distribution of the current flowing through active area 24 is thus more homogeneous over the light-emitting diode, and the intensity of the radiation emitted by active area 24 is thus also more homogeneous. The efficiency of the light-emitting diode is thus improved.

EBL 26, mostly made of a compound of the first, second, third, and fourth chemical elements, for example has a content of the fourth chemical element in the range from 10 to 40%, for example, in the range from 15 to 35%. EBL 26, mostly made of a compound of the first, second, third, and fourth chemical elements, for example has a content of the third chemical element in the range from 0.5 to 10%, for example, in the range from 1 to 5%.

Figure 4:
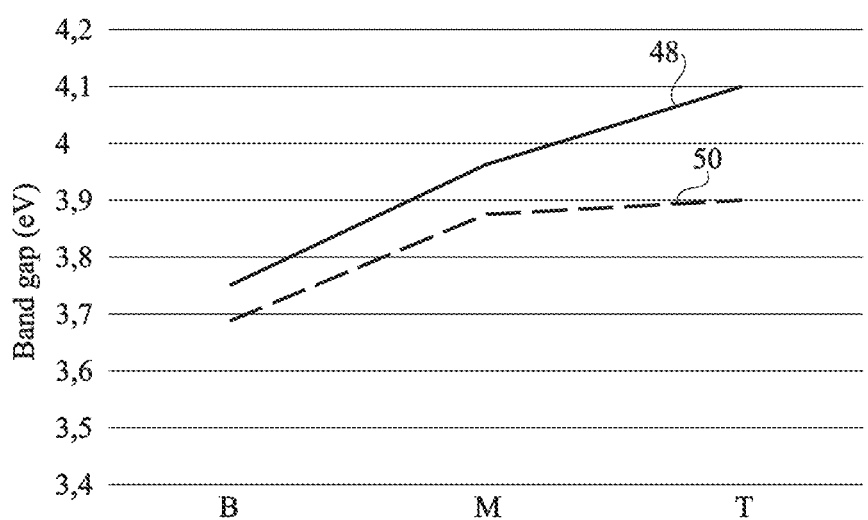
FIG. 4 shows curves of the variation, obtained by tests, of the bandgap (in eV) of one of the layers of the light-emitting diode shown in FIG. 1 according to the distance to the substrate having the light-emitting diode formed thereon.

FIG. 4 shows curves of the variation, obtained by tests, of the bandgap of EBLs 26 of the light-emitting diode shown in FIG. 1 according to the distance to the substrate having the light-emitting diode formed thereon. Curve 48 corresponds, like curve 42 of FIG. 3, to an EBL 26 mostly made of AlGaN and curve 50 corresponds, like curve 46 of FIG. 3, to an EBL 26 mostly made of AlInGaN.

For the tests, EBLs 26 have for example been formed at a pressure in the range from 75 to 500 Torrs and at a temperature in the range from 800 to 1,000° C. The precursors used are for example trimethylgallium at a flow rate of 82.75 sccm (standard cubic centimeters per minute) for gallium, ammonia at a flow rate of 50 l/min for nitrogen, trimethylindium at a flow rate of 900 sccm for indium, and trimethylaluminum at a flow rate of 570 sccm for aluminum.

It can be observed, as described in relation with FIG. 3, that curve 50 corresponding to AlInGaN varies significantly less than curve 48 associated with AlGaN, particularly for the upper portion of the wire. Further, the values of the bandgap of curve 50 are smaller than those of curve 48.

More particularly, according to the tests performed in the previously-described conditions, in the lower portion (B) of a wire having its EBL mostly made of AlGaN, the aluminum content is substantially equal to 15%, and the bandgap is substantially equal to 3.75 eV. In the middle of the wire (M), the aluminum content is substantially equal to 25%, and the bandgap is substantially equal to 3.96 eV. In the upper portion (T) of the wire, the aluminum content is substantially equal to 30%, and the bandgap is substantially equal to 4.1 eV.

According to the previously-described tests, in the lower portion (B) of a wire having its EBL mostly made of AlInGaN, the aluminum content is substantially equal to 15%, the indium content is substantially equal to 1%, and the bandgap is substantially equal to 3.7 eV. In the middle of the wire (M), the aluminum content is substantially equal to 25%, the indium content is substantially equal to 2%, and the bandgap is substantially equal to 3.88 eV. In the upper portion (T) of the wire, the aluminum content is substantially equal to 30%, the indium content is substantially equal to 5%, and the bandgap is substantially equal to 3.9 eV.

An advantage is that the third element which is added to the composition of the EBL is already present in the composition of other layers of the light-emitting diode, particularly in the active area. Injections of the precursor of the third element are thus already provided. The modifications to be made to the already-existing method are thus decreased.

Specific embodiments have been described. Various alterations and modifications will occur to those skilled in the art. In particular, the shape of the three-dimensional element is not limited to the examples described in the present disclosure.

Throughout the disclosure, it has been considered that the optoelectronic device comprises a light-emitting diode. However, the embodiments described herein may also be implemented in the case of photodiodes. In this case, the active area is capable of capturing an electromagnetic radiation and of converting the captured photons into charge carriers.

Further, the previously-described embodiments may also be applied to a HBL. Further, the EBL or HBL may be interposed between the active area and the three-dimensional semiconductor element.

Various embodiments with different variations have been described hereabove. It should be noted that those skilled in the art may combine various elements of these various embodiments and variations without showing any inventive step.

The invention claimed is:

1. An optoelectronic device comprising:
   a substrate;
   a three-dimensional semiconductor element, mostly made of a first chemical element and of a second chemical element, resting on the substrate;
   an active area at least partially covering the lateral walls of the three-dimensional semiconductor element and comprising a stack of at least a first layer mostly made of the first and second chemical elements, and of at least a second layer mostly made of the first and second chemical elements and of a third chemical element;
   a third layer covering the active area, the third layer being mostly made of the first, second, and third chemical elements and of a fourth chemical element, the mass proportion of the third and fourth chemical elements of the third layer increasing from the base to the top of the three-dimensional semiconductor element as the distance to the substrate increases or decreasing from the bottom to the top of the three-dimensional semiconductor element as the distance to the substrate increases; and
   a fourth layer, mostly made of the first and second chemical elements, covering the third layer.

2. The optoelectronic device of claim 1, wherein the active area is capable of emitting an electromagnetic radiation and wherein the third layer is a charge carrier blocking layer.

3. The optoelectronic device of claim 1, wherein the content of the third chemical element in the third layer is in the range from 0.1 to 10%.

4. The optoelectronic device of claim 1, wherein the content of the fourth chemical element in the third layer is in the range from 10 to 40%.

5. The optoelectronic device of claim 1, wherein the first chemical element is a group-III element.

6. The optoelectronic device of claim 1, wherein the first chemical element is gallium.

7. The optoelectronic device of claim 1, wherein the second chemical element is a group-V element.

8. The optoelectronic device of claim 1, wherein the second chemical element is nitrogen.

9. The optoelectronic device of claim 1, wherein the third chemical element is a group-III element.

10. The optoelectronic device of claim 1, wherein the third chemical element is indium.

11. The optoelectronic device of claim 1, wherein the fourth chemical element is a group-III element.

12. The optoelectronic device of claim 1, wherein the fourth chemical element is aluminum.

13. The optoelectronic device of claim 1, wherein the semiconductor element is wire-shaped.

14. The optoelectronic device of claim 1, wherein the semiconductor element is pyramid-shaped.

* * * * *